(12) United States Patent
Lin

(10) Patent No.: US 6,492,077 B1
(45) Date of Patent: Dec. 10, 2002

(54) MULTIPLE-RETICLE MASK HOLDER AND ALIGNER

(75) Inventor: Burn-Jeng Lin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 79 days.

(21) Appl. No.: 09/839,961

(22) Filed: Apr. 23, 2001

(51) Int. Cl.$^7$ .............................. G03F 9/00; G03C 5/00; G01J 1/00
(52) U.S. Cl. ...................... 430/22; 430/296; 250/491.1; 250/492.22; 356/399
(58) Field of Search ................ 430/22, 296; 250/491.1, 250/492.22; 356/399

(56) References Cited

U.S. PATENT DOCUMENTS

| | | | |
|---|---|---|---|
| 5,438,204 A | 8/1995 | von Bunau et al. | 250/492.2 |
| 5,838,450 A | 11/1998 | McCoy et al. | 356/401 |

*Primary Examiner*—Christopher G. Young
(74) *Attorney, Agent, or Firm*—George O. Saile; Stephen B. Ackerman; Larry J. Prescott

(57) ABSTRACT

An apparatus for making quick reticle changes in a projection exposure system without removing the wafer from the wafer holder and a method of using this apparatus to expose a layer of resist on a wafer. Key to the invention is a reticle holder having a number of reticle subholders each holding one reticle. Each of the reticle subholders has at least one reticle manipulator to position each reticle relative to the reticle holder. The reticle holder has interferometer mirrors on at least two orthogonal sides of the reticle holder so that the reticle holder can be positioned quickly with respect to a wafer using means such as a laser interferometer. Any reticle or part of a reticle in the reticle holder can be chosen to be used in exposing a part of the layer of resist. Any of the reticles or parts of the reticle can be chosen to form an exposure field. Reticles can be chosen to form multiple exposures or extended exposure fields. Reticle changes can be made quickly without removing the wafer from the wafer holder.

27 Claims, 3 Drawing Sheets

US 6,492,077 B1

MULTIPLE-RETICLE MASK HOLDER AND ALIGNER

BACKGROUND OF THE INVENTION (1) Filed of the Invention

This invention relates to an apparatus and method of quickly changing reticles used to expose a layer of resist on a wafer without the need to remove the wafer from the wafer holder. More particularly the invention relates to a reticle holder, which can be positioned relative to a wafer, having a number of reticle subholders, which can be positioned relative to the reticle holder. Reticles are placed in said reticle subholders and can be individually selected.

(2) Description of the Related Art

With increasing chip sizes it becomes increasingly important to increase the field size and improve the image quality of the photolithographic images used in the manufacture of the chips.

U.S. Pat. No. 5,438,204 to von Bunau et al. describes a twin mask system and method for forming photolithographic patterns. Two or more copies of a mask pattern are used in forming the images. The two or more copies are axially displaced from one another along the radiation path and are in axial alignment with each other along the radiation path. This arrangement provides increased depth of focus.

U.S. Pat. No. 5,838,450 to McCoy et al. describes a mask alignment system and methods which achieves reticle to wafer referencing. The system and methods provide information for complete field-by-field alignment for both step-and-repeat and scanning exposure systems.

SUMMARY OF THE INVENTION

As the resolution of optical lithography imaging systems increases, the field size must also increase to achieve chips with higher circuit densities and more circuits per chip. This larger field size is achieved by a number of methods.

The field size of the imaging lens in a projection systems can be increased. However, it is difficult to simultaneously increase both the resolution power and the lax field size of modern high numerical aperture large-field-size imaging lenses.

The step-and-repeat imaging system can be replaced by a step-and-scan imaging system so that the field size can be increased in the scanning direction. However, in the step-and-scan system the field size becomes limited by the size of the reticles. It is difficult to change the size of reticles because this would require extensive changes in the entire mask making infrastructure. If larger reticles could be achieved increased problems due to defects, loss of critical dimension uniformity, and placement errors are likely to occur.

In light of these problems, it would be highly advantageous to be able to quickly change reticles during the exposure process. Quick changes of reticles would be an advantage in situations where multiple exposures are called for, when the wafer map consists of more than one reticle, to reduce the reticle changing time for increased wafer throughput, or the like.

It is a principle objective of this invention to provide an apparatus which permits quick changing of reticles used by an exposure system to expose a wafer without removing the wafer from the wafer holder.

It is another principle objective of this invention to provide a method for exposing a layer of resist on a wafer using an apparatus which permits quick changing of reticles used by an exposure system to expose a wafer without removing the wafer from the wafer holder.

These objectives are achieved by the use of a reticle holder having a number of reticle subholders. Each of the reticle subholders holds one reticle. The reticle subholders have manipulators on two or three sides so that each reticle can be positioned relative to the reticle holder. The reticle holder has two interferometer mirrors on each side so that the reticle holder can be positioned quickly with respect to a wafer using means such as a laser interferometer. Using the means to position the reticle holder and the manipulators on each of the reticle subholders new reticles can be quickly be positioned with respect to the wafer being exposed.

DESCRIPTION OF THE PREFERRED EMBODIMENTS

Figure 1:
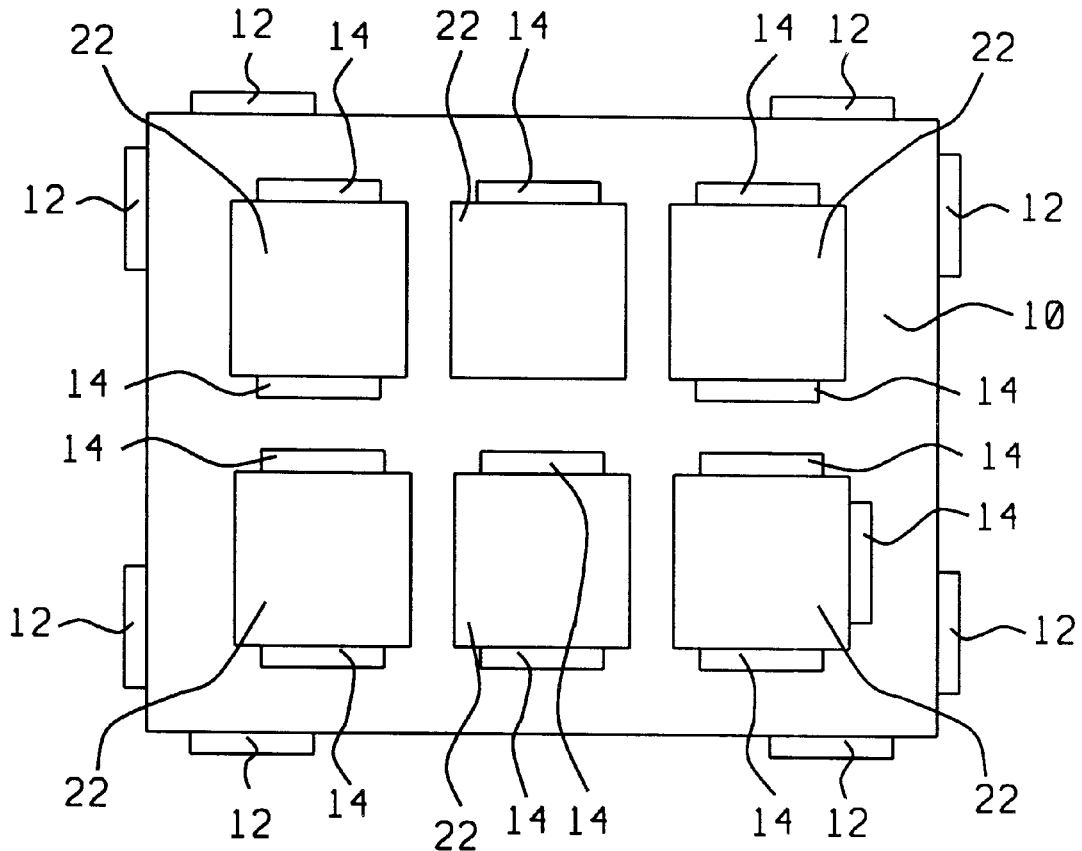
FIG. 1 shows a schematic diagram of the reticle holder, having interferometer mirrors and a number of reticle subholders with manipulators, of this invention.
Figure 2:
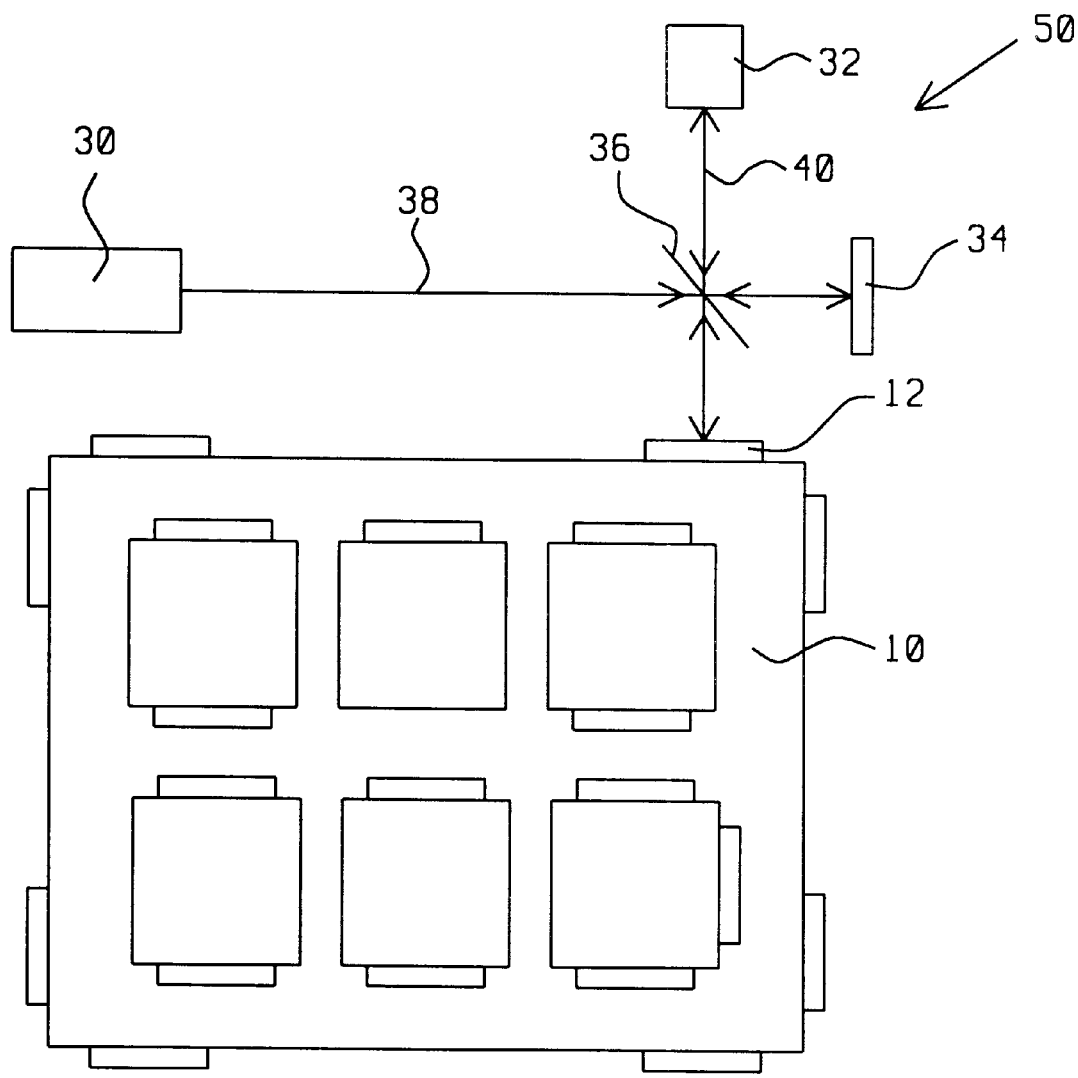
FIG. 2 shows a schematic diagram of a laser interferometer being used to control the position of the reticle holder of this invention.
Figure 3:
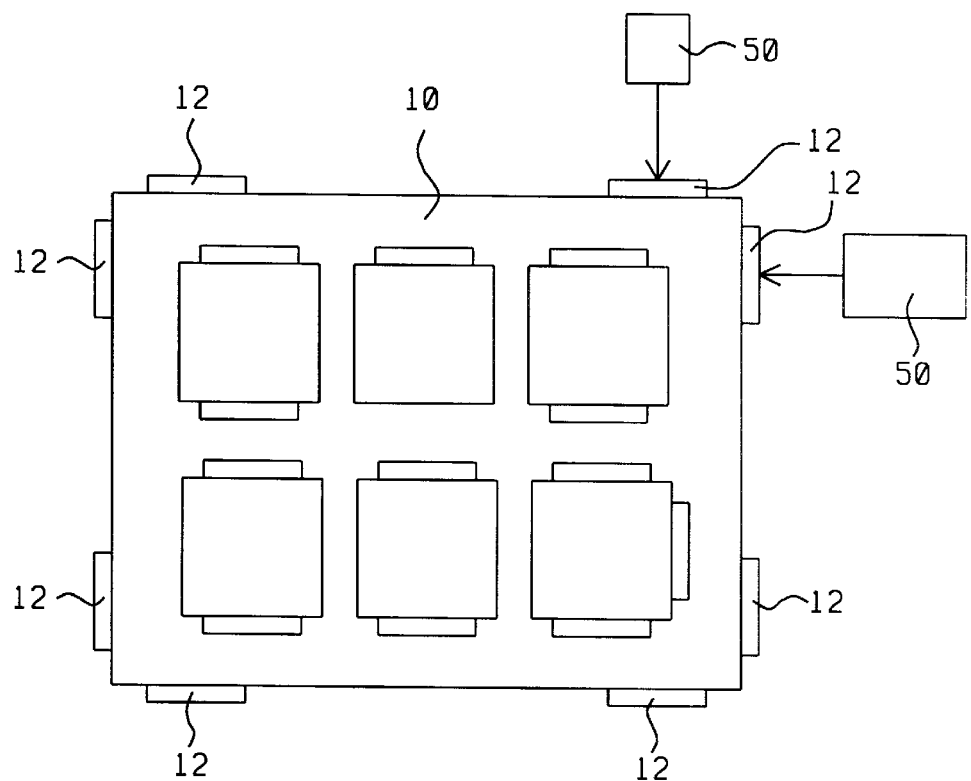
FIG. 3 shows a schematic diagram of two laser interferometers being used to control the position of the reticle holder of this invention.

Refer now to FIGS. 1–3 for a description of the reticle holder of this invention and of the method for using the reticle holder to expose a layer of resist formed on a wafer.

FIG. 1 shows a schematic view of the reticle holder 10 of this invention. The key to the invention is that the reticle holder 10 has a number of reticle subholders 22 in the reticle holder 10. The example shown in FIG. 1 has six reticle subholders 22 however the reticle holder of this invention can have any number of reticle subholders greater than one. Each of the reticle subholders will have at least one reticle manipulator 14 and may have more than one reticle manipulator 14. One of the reticle subholders 22 shown in FIG. 1 has one reticle manipulator 14. Four of the reticle subholders 22 shown in FIG. 1 have two reticle manipulators 14. One of the reticle subholders 22 shown in FIG. 1 has three reticle manipulators 14. The reticle manipulators 14 can be placed at any side of the reticle subholders 22 wherever space permits.

Reticles are placed in the subholders 22. The reticle manipulators 14 located at each subholder position are used to position the subholders, and thereby each of the reticles, with respect to the reticle holder 10. The manipulators 14 are able to move the subholders, and thereby the reticles, in two orthogonal directions in the reticle plane. The manipulators are also able to rotate the subholder, and thereby the reticles, in the reticle plane. In this manner the manipulators can position the reticles relative to the reticle holder with complete positional freedom in the reticle plane. In this invention one of the reticle subholders need not have the ability move the reticle in two orthogonal directions however the remaining reticle subholders must provide this capability. This is because the reticle holder can provide the positioning ability for the reticle in one reticle subholder.

In order to position the reticle holder the in a projection exposure system, and thereby position the reticle holder with respect to a wafer to be exposed, there are a number of interferometer mirrors 12 placed on the sides of the reticle holder 10. In the example shown in FIG. 1 there are two interferometer mirrors 12 on each side of the four sides of the reticle holder 10 for a total of eight interferometer mirrors 12. The two interferometer mirrors 12 on each side of the reticle holder 10 could be combined into a single long interferometer mirror. Although the example shown in FIG. 1 shows interferometer mirrors 12 on all four sides of the reticle holder 10 it is only necessary to have interferometer mirrors 12 on two orthogonal sides of the reticle holder 10. Thus a minimum of two interferometer mirrors 12 on two orthogonal sides of the reticle holder 10 are required. The interferometer mirrors 12 are used to monitor the position of the reticle holder 10 in two orthogonal directions in the reticle plane and the angle of the reticle holder 10 in the reticle plane. Interferometer mirrors 12 on two orthogonal sides of the reticle holder 10 are used to position the reticle holder 10 in two orthogonal directions in the reticle plane. One of these orthogonal directions will normally be the scan direction for a step and scan projection exposure system. Two interferometer mirrors 12, or one long interferometer mirror, on the same side of the reticle holder 10 are used to provide rotational positioning of the reticle holder 10 in the reticle plane.

FIG. 2 shows a schematic diagram of a laser interferometer system 50 used to position the reticle holder 10. The interferometer system 50 comprises a laser 30 emitting a light beam 38 which impinges on a beam splitter 36. Light passing through the beam splitter 36 is reflected by a reference mirror 34. Light reflected by the beam splitter 36 is reflected by one of the interferometer mirrors 12 on the reticle holder 10. The beam splitter 36 directs part of the light 40 from the reference mirror 34 and the interferometer mirror 12 to a detector 32 which monitors and counts the interference fringes produced by the path difference between the beam splitter 36 to the reference mirror 34 and the beam splitter 36 to the interferometer mirror 12. In this manner the interferometer system 50 can be used to position the reticle holder 10. FIG. 2 shows a single interferometer system. More than one interferometer can be used, as is shown in FIG. 3. FIG. 3 shows one interferometer system 50 for controlling positioning in one direction and another interferometer system 50 for controlling positioning in an orthogonal direction. Although not shown, those skilled in the art will recognize that more than two interferometer systems can be used.

Figure 4:
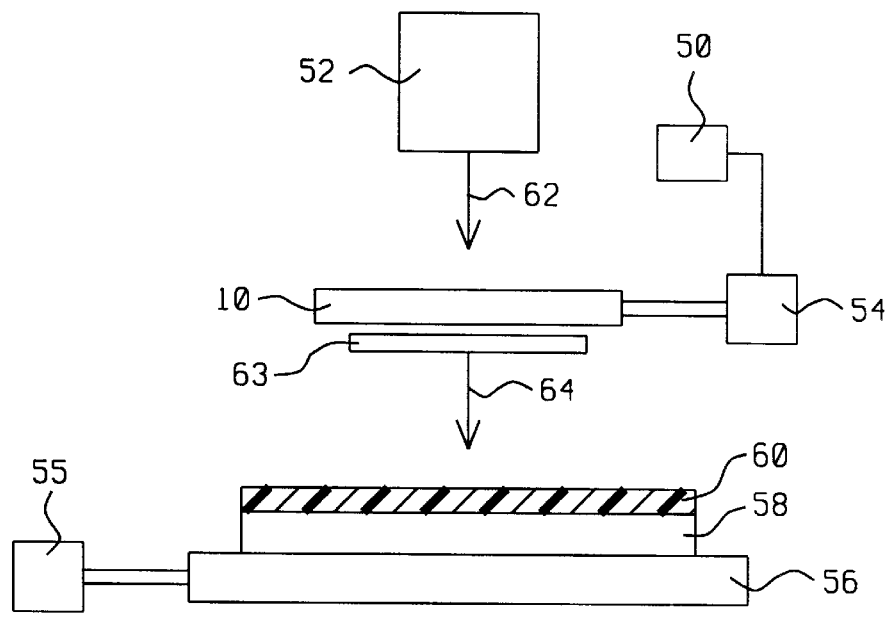
FIG. 4 shows a schematic diagram of the reticle holder of this invention used with a projection exposure system to expose a layer of resist formed on a wafer.

FIG. 4 shows a schematic diagram of a projection exposure and alignment system. As shown in FIG. 4 the system comprises a radiation source 52, such as a light source or e-beam source, a reticle holder 10 of this invention, a mechanical positioner 54 for controlling the position of the reticle holder 10 controlled by a laser interferometer system 50. Radiation 62 from the radiation source 52 is directed to reticles in the reticle holder 10. Light 64 passing through the reticles is focussed on a layer of resist 60 formed on a wafer 58. The wafer 58 is held in a wafer holder 56, which can also be positioned by a wafer aligner 55. The exposure system can either be a step-and-repeat system or a step-and-scan system. The step-and-repeat system also has a masking means 63 to block off part of the exposure system.

The preferred embodiment of the method to use the reticle holder of this invention to expose a layer of resist on a wafer is as follows. A wafer 58 having a layer of resist 60 formed thereon is placed on the wafer holder 56, see FIG. 4. Reticles are placed in each of the subholders 22, see FIG. 1. The reticle holder 10 is then positioned relative to the wafer 58 using the interferometer 50 and the wafer positioner 55 to select the desired reticle for the exposure, see FIG. 4. The final position of the reticle being used is then set using the manipulators 14, see FIG. 1. If it is required to mask off part of the reticle this is accomplished using the masking means 63, see FIG. 4. The layer of resist 60 is then exposed. The reticle holder 10 is then moved to bring the next reticle into place, possibly using the wafer positioner 55 as well. The final position of the next reticle is then set using the manipulators 14. The layer of resist 60 is then exposed using the new reticle. In this way reticle changes can be made quickly and can provide extended exposure fields, multiple exposures, or the like quickly and without the need to remove the wafer from the wafer holder.

Any combination of the reticles in the reticle holder can be used in any sequence to expose the layer of resist without removing the wafer from the wafer holder. Two or more reticles can be used to double expose an exposure field. The layer of resist can be first exposed using one or more reticles and then exposed using a composite of reticles. The layer of resist can be exposed so that parts of exposure fields are combined into a single exposure field. The layer of resist can be exposed so that exposure fields exposed using a number of parts of reticles are combined with exposure fields exposed using a number of full reticles to expose a single exposure field. The layer of resist can be exposed so that exposure fields exposed using a number of parts of reticles, exposure fields exposed using a number of full reticles, exposure fields exposed using composites of reticles, and exposure fields exposed using composites of parts of reticles are combined to form a single exposure field. The reticle holder can also be used to expose the layer of resist so that a plurality of reticles are used to expose a plurality of exposure fields to form a multi-die pattern. The reticle holder can also be used to accomplish double or multiple exposures using any composition of reticles or parts of reticles. All of these exposures can be accomplished without removing the wafer from the wafer holder.

While the invention has been particularly shown and described with reference to the preferred embodiments thereof, it will be understood by those skilled in the art that various changes in form and details may be made without departing from the spirit and scope of the invention.

What is claimed is:

1. A method of exposing a layer of resist on a wafer, comprising:

providing a wafer holder;

providing a projection mask aligner;

providing a radiation source;

providing a rectangular reticle holder for use with said projection mask aligner;

providing a plurality of rectangular reticle subholders in said reticle holder;

providing a number of reticle manipulators for said reticle subholders, wherein each of said reticle subholders has at least one of said reticle manipulators;

providing interferometer mirrors located on at least two orthogonal sides of said reticle holder;

providing means for positioning said reticle holder in said projection mask aligner relative to said wafer holder using said interferometer mirrors;

providing means for positioning each of said reticle subholders relative to said reticle holder using said reticle manipulators;

placing a wafer having a layer of resist formed thereon on said wafer holder;

placing reticles in said reticle subholders;

positioning said reticle holder relative to said wafer holder using said means for positioning said reticle holder;

positioning said reticles relative to said reticle holder using said means for positioning each of said reticle subholders; and exposing said layer of resist by projecting radiation from said radiation source through said positioned reticles onto said layer of resist.

2. The method of claim 1 wherein said projection mask aligner is a step-and-scan mask aligner.

3. The method of claim 2 further comprising scanning over more than one of said reticles to expose a larger exposure field than can be exposed using one reticle.

4. The method of claim 2 wherein said layer of resist is first exposed using a first composite of said reticles and then exposed using a second composite of said reticles.

5. The method of claim 2 wherein said layer of resist is first exposed using a first composite of said reticles and then exposed using a second composite of said reticles without removing said wafer from said wafer holder.

6. The method of claim 1 wherein said projection mask aligner is a step-and-repeat mask aligner.

7. The method of claim 1 wherein said layer of resist is first exposed using one of said reticles and then exposed using another of said reticles without removing said wafer from said wafer holder.

8. The method of claim 1 wherein said layer of resist is first exposed using one or more of said reticles and then exposed using a composite of said reticles.

9. The method of claim 1 wherein said reticle holder is used to expose said layer of resist so that parts of exposure fields are combined into a single exposure field.

10. The method of claim 1 wherein said reticle holder is used to expose said layer of resist so that exposure fields exposed using a number of parts of said reticles are combined with exposure fields exposed using a number of full said reticles to expose a single exposure field.

11. The method of claim 1 wherein said reticle holder is used to expose said layer of resist so that exposure fields exposed using a number of parts of said reticles, exposure fields exposed using a number of full said reticles, exposure fields exposed using composites of said reticles, and exposure fields exposed using composites of parts of said reticles are combined to form a single exposure field.

12. The method of claim 1 wherein a plurality of reticles are used to expose a plurality of exposure fields on said layer of resist to form a multi-die pattern in said layer of resist.

13. The method of claim 1 wherein one or two of said reticles are used to double expose an exposure field in said layer of resist.

14. The method of claim 1 wherein one or two of said reticles are used to double expose an exposure field in said layer of resist without removing said wafer from said wafer holder.

15. The method of claim 1 wherein one or more of said reticles are used to accomplish multiple exposures of an exposure field in said layer of resist.

16. The method of claim 1 wherein one or more of said reticles are used to accomplish multiple exposures of an exposure field in said layer of resist without removing said wafer from said wafer holder.

17. An apparatus for holding and positioning a plurality of reticles, comprising:

a wafer holder;

a projection mask aligner;

a rectangular reticle holder for use with said projection mask aligner;

a plurality of rectangular reticle subholders in said reticle holder;

a number of reticle manipulators for said reticle subholders, wherein each of said reticle subholders has at least one of said reticle manipulators;

interferometer mirrors located on at least two orthogonal sides of said reticle holder;

means for positioning said reticle holder in said projection mask aligner relative to said wafer holder using said interferometer mirrors; and means for positioning each of said reticle subholders relative to said reticle holder using said reticle manipulators.

18. The apparatus of claim 17, wherein said projection mask aligner is a step-and-scan mask aligner.

19. The apparatus of claim 17, wherein said projection mask aligner is a step-and-repeat mask aligner.

20. The apparatus of claim 19 wherein said step-and-repeat mask aligner comprises masking means to block off parts of the exposure field.

21. The apparatus of claim 17 wherein said means for positioning said reticle holder in said projection mask aligner uses one or more laser interferometers.

22. The apparatus of claim 17 wherein said reticle holder can be moved in one direction in the reticle plane.

23. The apparatus of claim 22 wherein said means for positioning said reticle holder in said projection mask aligner uses one or more laser interferometers.

24. The apparatus of claim 17 wherein said reticle holder can be moved in multiple directions in the reticle plane.

25. The apparatus of claim 24 wherein said means for positioning said reticle holder in said projection mask aligner uses laser interferometers.

26. The apparatus of claim 17 wherein said means for positioning each of said reticle subholders provides independent linear adjustment of each of said reticles along a first direction and a perpendicular second direction, and independent rotational adjustment of each of said reticles in the plane formed by said first direction and said second direction.

27. The apparatus of claim 17 wherein said projection mask aligner comprises alignment means to align each reticle.

* * * * *